United States Patent [19]

Erstfeld

[11] Patent Number: 4,487,640
[45] Date of Patent: Dec. 11, 1984

[54] METHOD FOR THE PREPARATION OF EPITAXIAL FILMS OF MERCURY CADMIUM TELLURIDE

[75] Inventor: Thomas E. Erstfeld, Bedford, Mass.

[73] Assignee: The United States of America as represented by the Secretary of the Air Force, Washington, D.C.

[21] Appl. No.: 468,781

[22] Filed: Feb. 22, 1983

[51] Int. Cl.$^3$ .................. H01L 21/365; H01L 29/221
[52] U.S. Cl. .................... 148/175; 29/576 E;
  156/610; 156/611; 156/613; 156/614;
  156/DIG. 72; 156/DIG. 82; 252/62.3 ZT
[58] Field of Search ................ 148/175; 29/576 E;
  156/610, 611, 613, 614, DIG. 72, DIG. 82,
  DIG. 92; 252/62.3 ZT; 357/61

[56] References Cited

U.S. PATENT DOCUMENTS 3,145,125  8/1964  Lyons ................................. 148/175
3,218,203  11/1965  Ruehrwein ................... 252/62.3 ZT
3,312,571  4/1967  Ruehrwein ......................... 148/175

OTHER PUBLICATIONS

Golacki et al., "Crystallization of HgCd.Te—Chemical Transport" J. Crystal Growth, vol. 47, 1979, pp. 749-750.

Taylor, R. C., "Epitaxial Deposition of GaAs in an Argon Atmosphere" J. Electrochem. Soc., vol. 114, No. 4, Apr. 1967, pp. 410-412.

Primary Examiner—William G. Saba
Attorney, Agent, or Firm—Donald J. Singer; William J. O'Brien

[57] ABSTRACT

A method for depositing a (Hg,Cd)Te film onto a CdTe substrate by using two separate vaporizeable sources of reactant materials each maintained at separate and distinct temperatures followed by the step of mixing both of each sources with a hydrogen halide gas and passing the resulting mixtures over a CdTe substrate maintained at a lower temperature distinct and different from the temperatures maintained during vaporization of the two distinct vaporizeable sources.

3 Claims, 1 Drawing Figure

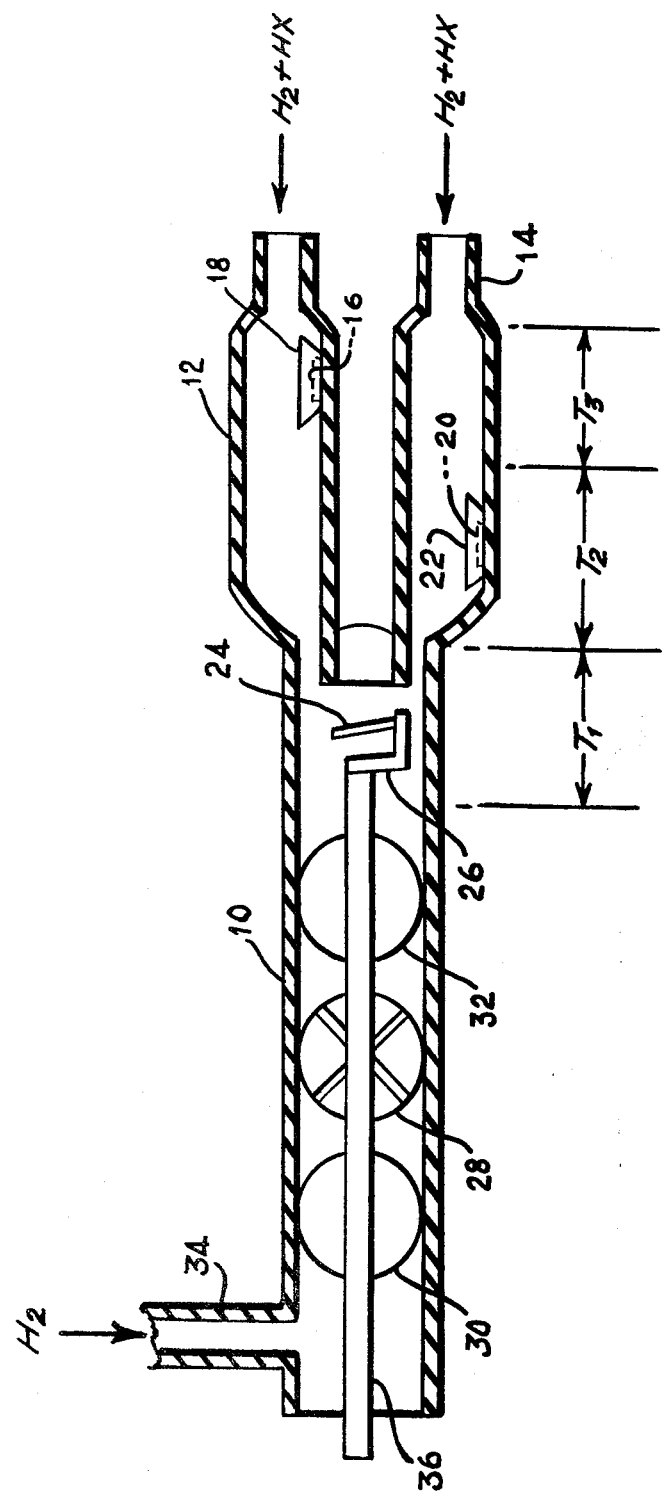

METHOD FOR THE PREPARATION OF EPITAXIAL FILMS OF MERCURY CADMIUM TELLURIDE

STATEMENT OF GOVERNMENT INTEREST

The invention described herein may be manufactured and used by or for the Government for governmental purposes without the payment of any royalty thereon.

BACKGROUND OF THE INVENTION

The present invention relates, in general, to a process for depositing II-VI ternary semiconductor compounds as an epitaxial film onto a semiconductor substrate that is crystallographically compatible with said deposited film. In a more particular aspect, this invention concerns itself with the vapor phase deposition of a ternary mercury cadmium telluride compound as an epitaxial film onto a cadmium telluride substrate. The resulting film finds particular utility as an intrinsic photodetector for infrared applications in wavelengths of from about 1 to 30 micrometers.

As is well known by those skilled in semiconductor technology, II-VI semiconductor compounds are those which include elements from group II and group VI of the Periodic Table of Elements. The components of these compounds can be binary or ternary mixtures of any of those elements. Among one of the better known and more useful II-IV compounds is the ternary mixture of the elements mercury, cadmium and tellurium. Mercury-cadmium-telluride alloys, often referred to by their chemical designation of (Hg,Cd)Te or $Hg_{1-x}Cd_xTe$ where x is an integer of greater than zero and less than one, have been found to be useful in a wide variety of semiconductor applications. They are especially useful and valuable as infrared detectors because in actuality they consist of a mixture of HgTe and CdTe. HgTe is characterized by a zero energy gap as opposed to a 1.5 e.v. energy gap possessed of CdTe. The final energy gap of the mixture can be predetermined by controlling the x value in order to render the mixture sensitive to a particular wavelength, thus providing the mixture with great versatility for use in numerous semiconductor applications. For example, a gap width of 0.1 e.v. provides the basis for using the (Hg,Cd)Te compound as an intrinsic infrared detector in the 8-14 micrometer range operable at 77° K.

The tremendous interest in fabricating and utilizing infrared detection devices has spawned a considerable research effort in an attempt to grow high quality (Hg,Cd)Te compounds. A number of methods for accomplishing the synthesis of these ternary compounds are well known. Among the more important techniques is that involving the bulk growth of homogeneous crystals of the (Hg,Cd)Te alloy. In this technique, a liquid solution of predetermined composition is quenched to form a solid body of (Hg,Cd)Te. Next the solid body is annealed to remove dendrites. Finally, the (Hg,Cd)Te is annealed in the presence of mercury at a lower temperature than its first anneal to adjust its stoichiometry. The final anneal takes about 30 days. Unfortunately, the final product often contains foreign atoms or defects in the crystal lattice which provides undesirable trapping or recombination centers.

A number of other bulk growth techniques, such as zone melting, have also been resorted to; but, all require post growth processing. Also, the resulting crystal must be sliced, polished and etched prior to affixing it to a substrate by employing an epoxy adhesive. The additional step of using an epoxy adhesive poses even further problems in the creation of an undesirable thermal barrier between the (Hg,Cd)Te crystal film and the substrate.

In an attempt to overcome the problems associated with bulk grown crystals, those skilled in the art resorted to epitaxial film growth techniques. The epitaxial film is grown on a suitable substrate by vapor phase or liquid phase epitaxy. The resulting film is single crystal, smooth, continuous and crystallographically compatible with the substrate. It is characterized by uniformity in thickness and electrical properties. In addition, the utilization of epitaxial film techniques avoids the use of an epoxy bonding layer, as well as the other post growth procedures and their attendant problems.

The growth of epitaxial layers of (Hg,Cd)Te on cadmium telluride substrates, however, has been difficult to achieve by vapor phase epitaxial techniques because of the high pressure of the constituent elements. With the present invention, however, it has been found that high quality, detector grade, (Hg,Cd)Te epitaxial films can be grown effectively on a cadmium telluride (CdTe) substrate at moderate temperatures and pressures by the unique vapor phase technique of this invention. This technique, in general, involves the utilization of a double barrel reactor having three separate and distinct temperature zones for effecting the deposition of the (Hg,Cd)Te film.

SUMMARY OF THE INVENTION

In accordance with the general concept of this invention, it has been found that high quality epitaxial films of (Hg,Cd)Te suitable for use as infrared detectors can be grown onto cadmium telluride substrates using a double barrel reactor and the technique of passing a hydrogen halide gas over separate CdTe and $HgTe/Te_2$ vaporizeable sources maintained at separate and distinct temperatures in the separate barrels of the reactor. Heretofore, the growth of (Hg,Cd)Te epitaxial films by vapor phase epitaxy proved difficult because of the high pressures of the elements used. Even the most current methods, which rely on liquid phase epitaxy, also proved to be difficult because the high temperatures required by liquid phase epitaxy often caused compositional grading in the (Hg,Cd)Te layer. Changes in compositional content often result in undesirable variations in the spectral response of the material. However, by resorting to the unique and novel technique of this invention, the growth of epitaxial layers of (Hg,Cd)Te can be accomplished without the attendant problems encountered by compositional variations in the epitaxially grown film.

Accordingly, the primary object of this invention is to provide a novel method for growing epitaxial films of (Hg,Cd)Te that possess a uniform gradient compositional content and are relatively free from defects.

Another object of this invention is to grow epitaxial films of (Hg,Cd)Te onto a suitable cadmium telluride substrate.

Still another object of this invention is to provide a novel method of depositing a (Hg,Cd)Te film by vapor phase epitaxy in which two distinct and separate vaporizeable sources of reactant material are maintained at different temperatures and used in conjunction with a hydrogen halide reactant gas during the deposition and formation of the film.

The above and still other objects and advantages of the present invention will become more readily apparent upon consideration of the following detailed description thereof when viewed in conjunction with the accompanying drawing.

BRIEF DESCRIPTION OF THE DRAWING

In the drawing:

The figure in the drawing represents a schematic illustration of a quartz reactor suitable for use in the method of this invention.

DESCRIPTION OF THE PREFERRED EMBODIMENTS

Pursuant to the above-defined objects, the present invention provides a novel vapor phase method for depositing mercury cadmium telluride (Hg,Cd)Te films onto a cadmium telluride (CdTe) substrate. The epitaxial layer is grown by using a double-barrel reactor with three temperature zones and the passing of a hydrogen halide gas (chloride, bromide or iodide) over separate CdTe and HgTe/Te$_2$ vaporizeable reactant sources. The two separate souces are maintained in the two different barrels of the reactor at two different temperatures. The hydrogen halide gas is carried by either hydrogen or a hydrogen/argon carrier gas. The use of the method of this invention permits the growth of high quality films characterized by uniform compositional gradients at relatively moderate temperatures and ambient pressures.

In general, the epitaxial films of this invention are grown by vapor phase epitaxy by interreacting, at a particular temperature, two separate vaporized reactant mixtures each previously maintained at a temperature separate and distinct from one another as well as being distinct and different from the temperature maintained during deposition of the film. One source, composed of CdTe, is maintained at a temperature of about 1080°–1120° K. The other source, composed of HgTe/Te$_2$, is maintained at a temperature of about 880° to 925° K., while the substrate, upon which the film is to be deposited, is maintained at a temperature approximately 20° K. lower than the temperature of the two sources and within a temperature range of from about 850° to 900° K.

In the method this invention, the first gaseous mixture of CdTe is formed by passing a mixed stream of a hydrogen halide/carrier gas mixture over a CdTe source maintained at a predetermined temperature. The second gaseous mixture of HgTe/Te$_2$ is formed by passing a stream of a hydrogen halide from a separate and distinct source carrier gas mixture over a HgTe/Te$_2$ source maintained at its predetermined temperature. The two gaseous mixtures are then transported into the deposition zone of the reactor which contains a cadmium telluride substrate maintained at its predetermined temperature where deposition of the (Hg,Cd)Te film onto the cadmium telluride substrate takes place. The flow rates of each carrier gas stream can vary from 50 standard cubic centimeters per minute to 1000 standard cubic centimeters per minute, and the total gas pressure can vary from 5 to 30 pounds per square inch above ambient pressure.

The reactor, as can be seen by referring to the accompanying drawing, possesses three separate temperature zones in which the deposition zone is maintained at a temperature approximately 20° K. lower than the temperature of the source zones. The HgTe source should contain some Te$_2$ since it is well known, as shown by Golacki et al., J. Crystal Growth, 47, 749–750 (1979), that without some Te$_2$ present with the HgTe source, very little mercury will be incorporated into the (Hg,Cd)Te film. The concentration of the hydrogen halide (HX where X represents a halogen atom of chlorine, bromine or iodine) in the hydrogen carrier gas may be varied from one to ten volume percent. At these concentrations, considerable control can be maintained over the amount of mercury, cadmium and tellurium species entering the deposition zone of the reactor. If a pure hydrogen atmosphere is too reducing then a hydrogen/argon carrier mixture can be substituted.

In order to illustrate how the present invention is carried into effect, reference is now made to the drawing which discloses a double barrel vapor phase growth apparatus suitable for this invention. The apparatus comprises an elongated quartz tube 10 having two separate barrels or source zones 12 and 14. The reactor is divided into three separate temperature zones $T_1$, $T_2$ and $T_3$. A source 16 composed of cadmium telluride (CdTe) is positioned in a suitable crucible 18 within the barrel 12 and temperature zone $T_3$. This zone is maintained at a temperaure of from about 1080° to 1120° K. A second source 20 composed of HgTe/Te$_2$ is positioned in a suitable crucible 22 within barrel 14 and temperature zone $T_2$. Temperature zone $T_2$ is maintained at a temperature of from about 880° to 1120° K. A CdTe substrate 24, attached to a suitable holder 26 and rod holder 36, is positioned within the quartz tube 10 and temperature zone $T_1$ maintained at a temperature at least 20° K. lower than the temperature of zones $T_1$ and $T_2$. The deposition zone $T_1$ is maintained within a temperature range of from about 850° to 900° K. An entry port 28 is provided for introducing rod 36 and the attached substrate 24. Also, exhaust ports 30 and 32 are provided to exhaust the forechamber of the reactor.

In the process of the invention, the reactor is first flushed with an inert gas, such as nitrogen or hydrogen. The inert gas enters through inlet 34 and exits through the exhaust port 30. Gas flow rates for the hydrogen chloride, carrier and inert gases are controlled and regulated by Tylan mass flow controllers not shown.

The invention is further illustrated by the following examples:

EXAMPLE 1

A polished, then chemically etched wafer of CdTe 24 (the substrate) is placed in the forechamber of the reactor 10. A stream of hydrogen is then introduced through inlet 34 and allowed to flow over the CdTe substrate 24 at a rate of about 500 standard cubic centimeters per minute for 15 minutes to remove atmospheric impurities. This hydrogen flow is then lowered to 50 standard cubic centimeters per minute and is kept at this rate for the rest of the time the reaction is run.

The entry port 32 is opened and the rod 36, holding the CdTe substrate 24, is inserted into Zone $T_1$, which is at a temperature of 880 K. A flow rate of 495 standard cubic centimeters per minute of hydrogen and 5 standard cubic centimeters per minute of HCl is then allowed to pass over the source boat 18 containing the CdTe source 16. The source 16 is located in zone $T_3$, which is maintained at a temperature of 1100 K. Simultaneously, the same flow combination of hydrogen and HCl is allowed to pass over the source boat 22 containing source 20 composed of HgTe and 5% by weight Te$_2$. Source 20 is located in zone $T_2$ and maintained at a temperature of 900 K. These flows of hydrogen and HCl will produce volatile species of Cd, Hg and Te which will be transported to zone $T_1$, where they will deposit as a substantial layer of (Hg,Cd)Te on the CdTe substrate in about 1½ hours.

EXAMPLE 2

The same procedure outlined in Example 1 is followed, but zone $T_1$ is at 850 K. A flow rate of 95 standard cubic centimeters per minute of hydrogen and 5 standard cubic centimeters per minute of HBr is allowed to pass over the source boat 18 contaiing CdTe which is located in zone $T_3$, which is at a temperature of 1120 K. Simultaneously, a flow rate of 114 standard cubic centimeters per minute of hydrogen and 6 standard cubic centimeters per minute of HBr is allowed to pass over the source boat 22 containing HgTe and $Te_2$, which is located in zone $T_2$, which is at a temperature of 880 K. A substantial layer of (Hg,Cd)Te will deposit on the CdTe substrate in 2 hours.

EXAMPLE 3

The same procedure outlined in Example 1 is followed, but zone $T_1$ is at 900 K. A flow rate of 225 standard cubic centimeters per minute of hydrogen and 25 standard cubic centimeters per minute of HI is allowed to pass over the source boat 18 containing CdTe, which is located in zone $T_3$ and maintained at a temperature of 1080 K. Simultaneously, a flow rate of 207 standard cubic centimeters per minute of hydrogen and 23 standard cubic centimeters per minute of HI is allowed to pass over the source boat 22 containing HgTe and $Te_2$, which is located in zone $T_2$ and maintained at a temperature of 925 K. This will allow a substantial layer of (Hg,Cd)Te to deposit on the CdTe substrate in about 1 hour.

EXAMPLE 4

The same procedure outlined in Example 1 is followed, but zone $T_1$ is at 885 K. A flow rate of 294 standard cubic centimeters per minute of hydrogen and 6 standard cubic centimeters per minute of HBr is allowed to pass over the source boat 18 containing CdTe, which is located in zone $T_3$ and mentioned at a temperature of 1090 K. Simultaneously, a flow rate of 340 standard cubic centimeters per minute of hydrogen and 10 standard cubic centimeters per minute of HBr is allowed to pass over the source boat 22 containing HgTe and $Te_2$, which is located in zone $T_2$ and maintained at a temperature of 910 K. A substantial layer of (Hg,Cd)Te will deposit on the CdTe substrate in about 1½ hours.

EXAMPLE 5

The same pocedure outlined in Example 1 is followed, but zone $T_1$ is at 875 K. A flow rate of 490 standard cubic centimeters per minute of 10% hydrogen in argon and 10 standard cubic centimeters per minute of HCl is allowed to pass over the source boat 18 containing CdTe, which is located in zone $T_3$ and maintained at a temperature of 1100 K. Simultaneously, a flow rate of 487 standard cubic centimeters per minute of 10% hydrogen in argon and 12 standard cubic centimeters per minute of HCl is allowed to pass over the source boat 22 containing HgTe and $Te_2$, which is located in zone $T_2$ and mentioned at a temperature of 905 K. This will allow a substantial layer of (Hg,Cd)Te to deposit on the CdTe substrate in about 1 hour.

The epitaxial layers of the II–VI compounds are the basic structures for the fabrication of many new and useful electronic devices. Among these devices that utilize epitaxial layered structures are lasers, light-emitting diodes, photodetectors, solar cells, optoelectronic switches, field-effect transistors, gunn-effect diodes, varactors, and IMPATTS. The lasers and photodetectors are suitable for use in applications such as audio disk playbacks and laser printers.

While the principles of this invention have been described with particularity, it should be understood by those skilled in the art that various alterations and modifications can be made without departing from the spirit of the invention, and that all such modifications as are included within the scope of the appended claims are intended to be included herein.

I claim:

1. A method for preparing and depositing an epitaxial crystalline film onto the surface of a semiconductor substrate crystallographically compatible with said film which comprises the steps of:
   a. positioning a cadmium telluride substrate in a first deposition zone located at one end of an elongated reaction chamber while maintaining said first zone at a predetermined first temperature within a temperature range of about 850° to 900° K.;
   b. positioning a first reactant source composed of $HgTe/Te_2$ in a second reactant zone located upstream from said first zone while maintaining said second zone at a predetermined second temperature within a temperature range of about 880° to 925° K. and which predetermined second temperature is at least 20° K. higher than the said predetermined first temperature of said first zone;
   c. positioning a second reactant source composed of cadmium telluride in a third reactant zone located separately and adjacent to said second zone and upstream from said first zone while maintaining said third zone at a predetermined third temperature within a temperature range of from about 1080° to 1120° K. and which predetermined third temperature is at least 20° K. higher then the predetermined first temperature of said first zone;
   d. passing a separate stream of a hydrogen halide gas selected from the group consisting of hydrogen bromide, hydrogen chloride and hydrogen iodide invidicually over each of said first and second reactant sources to produce respective first and second gaseous reactants;
   e. introducing said first and second gaseous reactants into saif first deposition zone to form a gaseous admixture; and
   f. contacting said substrate with said admixture at said predetermined first temperature sufficient to effect the deposition of a (Hg,Cd)Te epitaxial crystalline film on the surface of said substrate.

2. A method in accordance with claim 1 wherein said hydrogen halide gas stream further includes the addition of an inert carrier gas.

3. A method in accordance with claim 2 wherein said hydrogen halide is present in said stream in a concentration of about one to ten volume percent of said stream.

* * * * *